United States Patent [19]

Kuroda et al.

[11] Patent Number: 5,313,073
[45] Date of Patent: May 17, 1994

[54] LIGHT DETECTOR USING INTERSUB-VALENCE BAND TRANSITIONS WITH STRAINED BARRIERS

[75] Inventors: Roger T. Kuroda, Palos Verdes; Elsa M. Garmire, Manhattan Beach, both of Calif.

[73] Assignee: University of Southern California, Los Angeles, Calif.

[21] Appl. No.: 926,850

[22] Filed: Aug. 6, 1992

[51] Int. Cl.$^5$ .................... H01L 31/04; H01L 29/205
[52] U.S. Cl. .................................. 257/18; 257/21; 257/188; 257/189; 257/190
[58] Field of Search ............... 257/18, 21, 188, 189, 257/190

[56] References Cited

U.S. PATENT DOCUMENTS

| | | | |
|---|---|---|---|
| 4,607,272 | 8/1986 | Osbourn | 257/21 |
| 4,616,241 | 10/1986 | Biefeld | 257/21 |
| 4,843,439 | 6/1989 | Cheng | 257/21 |
| 4,894,526 | 1/1990 | Bethea et al. | 250/211 R |
| 5,001,521 | 3/1991 | Okuda | 257/18 |
| 5,013,918 | 5/1991 | Choi | 250/338.4 |

OTHER PUBLICATIONS

West et al., "First observation of an extremely large-dipple infrared transition within the conduction band of a GaAs quantum well", in *Applied Physics Letters*, vol. 46, pp. 1156–1158 (1985).
Levine et al., "High sensitivity low dark current 10 um GaAs quantum well infrared photodetectors", in *Applied Physics Letters*, vol. 56, pp. 851–853 (1990).
Coon et al., "New mode of IR detection using quantum wells", in *Applied Physics Letters*, vol. 45, pp. 649–651 (1984).
Levine et al., "Normal incidence hole intersubband absorption long wavelength GaAs/Al$_x$Ga$_{1-x}$As quantum well infrared photodetectors", in *Applied Physics Letters*, vol. 59, pp. 1864–1866 (1991).
G. Ji et al, "Optical investigation of highly strained InGaGa–GaAs multiple quantum wells", in *Journal of Applied Physics*, vol. 62, pp. 3366–3373 (1987).
J. W. Matthews et al., "Defects in Epitaxial Multiplayers. I. Misfit Dislocations", in *Journal of Crystal Growth*, vol. 27, pp. 118–125 (1974).
J. P. Hirth et al., "Damage of coherent multilayer structures by injection of dislocations or cracks", in *Journal of Applied Physics*, vol. 60, pp. 2372–2376 (1986).
J. W. Matthews et al., "Almost perfect epitaxial multilayers", in *Journal of Vacuum Science and Technology*, vol. 14, pp. 898–991 (1977).
S. Adachi, "GaAs, AlAs, and Al$_x$Ga$_{1-x}$As: Material parameters for use in research and device applications", in *Journal of Applied Physics*, vol. 58, pp. R1–R29 (1985).
E. L. Derniak et al., in *Optical Radiation Detectors*, John Wiley & Sons, Inc., New York, p. 97 (1984).
H. Asai et al., "Intersubband absorption in highly strained InGaAs/InAlAs multiquantum wells", in *Applied Physics Letters*, vol. 56, pp. 746–748 (Feb. 19, 1990).

*Primary Examiner*—Jerome Jackson
*Attorney, Agent, or Firm*—Benman Collins & Sawyer

[57] ABSTRACT

An intersub-valence band quantum well detector (52), comprising alternating quantum wells (30') and barriers (32'), provided with differential strain permits obtaining hole mean free paths similar to the electron. Consequently, the gain and responsivity should dramatically increase. In addition, the absorption coefficient should increase, while the noise current should decrease; thus, the quantum efficiency and the detectivity (D*) should increase, compared to a detector without the added differential strain.

15 Claims, 11 Drawing Sheets

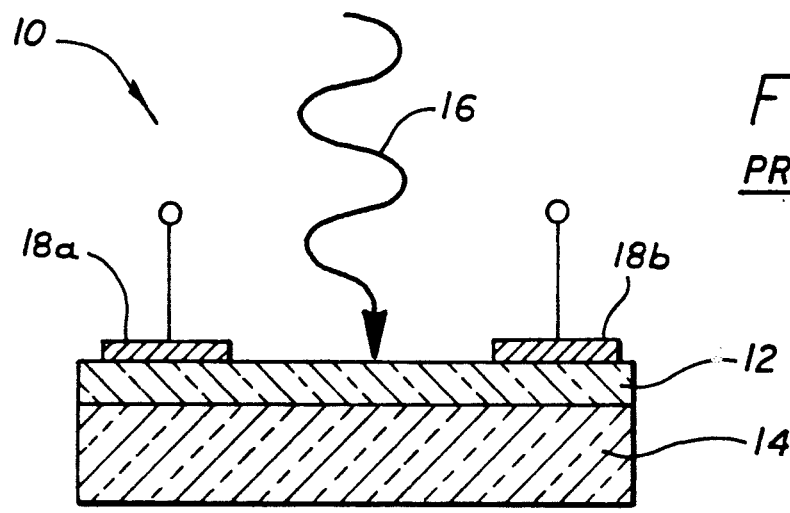
FIG. 1a
PRIOR ART
FIG. 1b
PRIOR ART
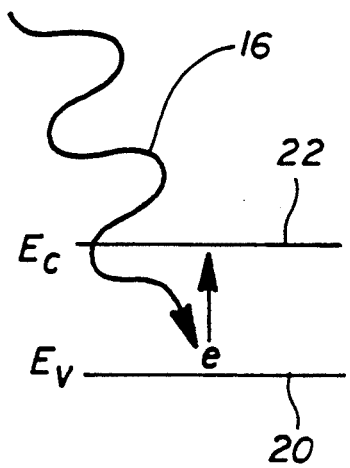
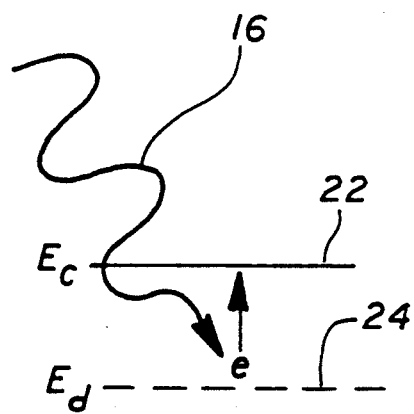
FIG. 1c
PRIOR ART
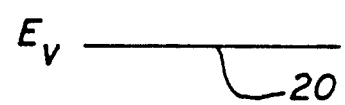

FIG. 4a
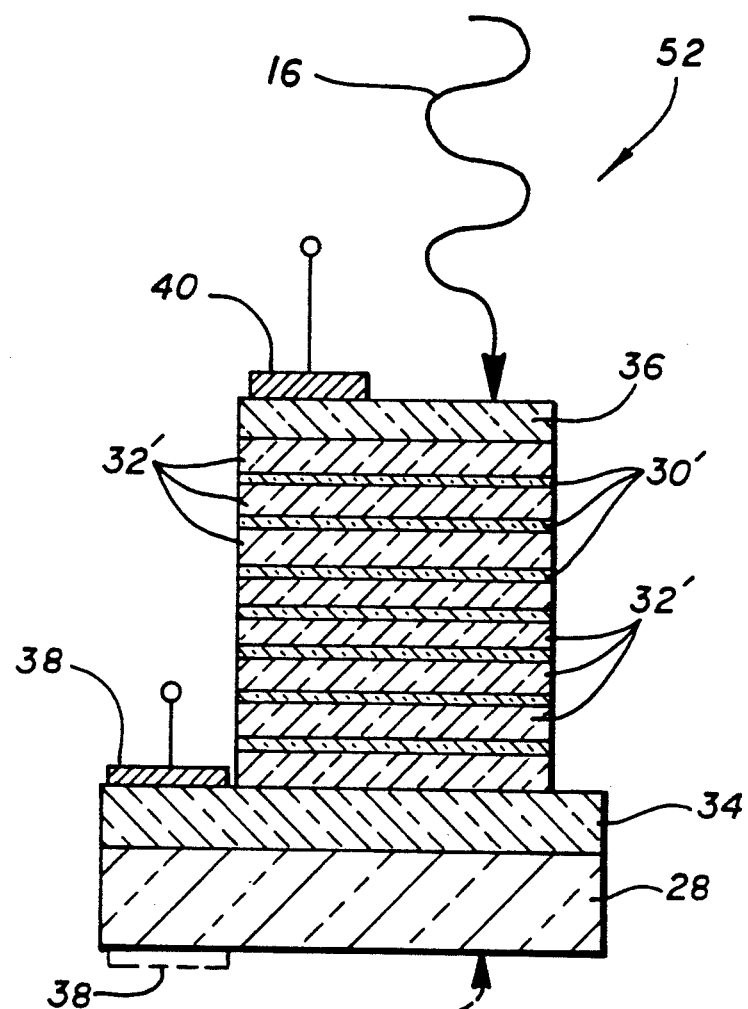
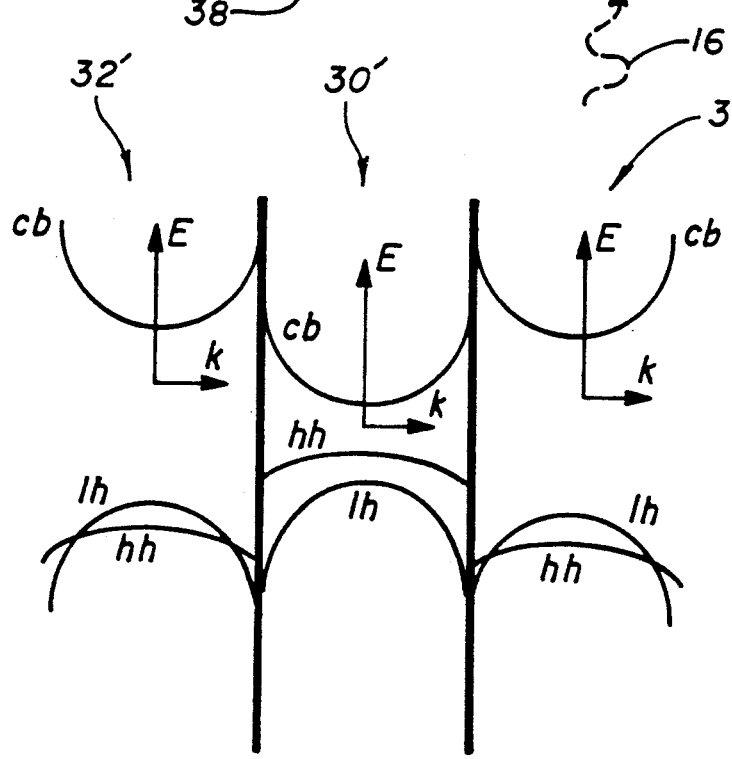
FIG. 4b

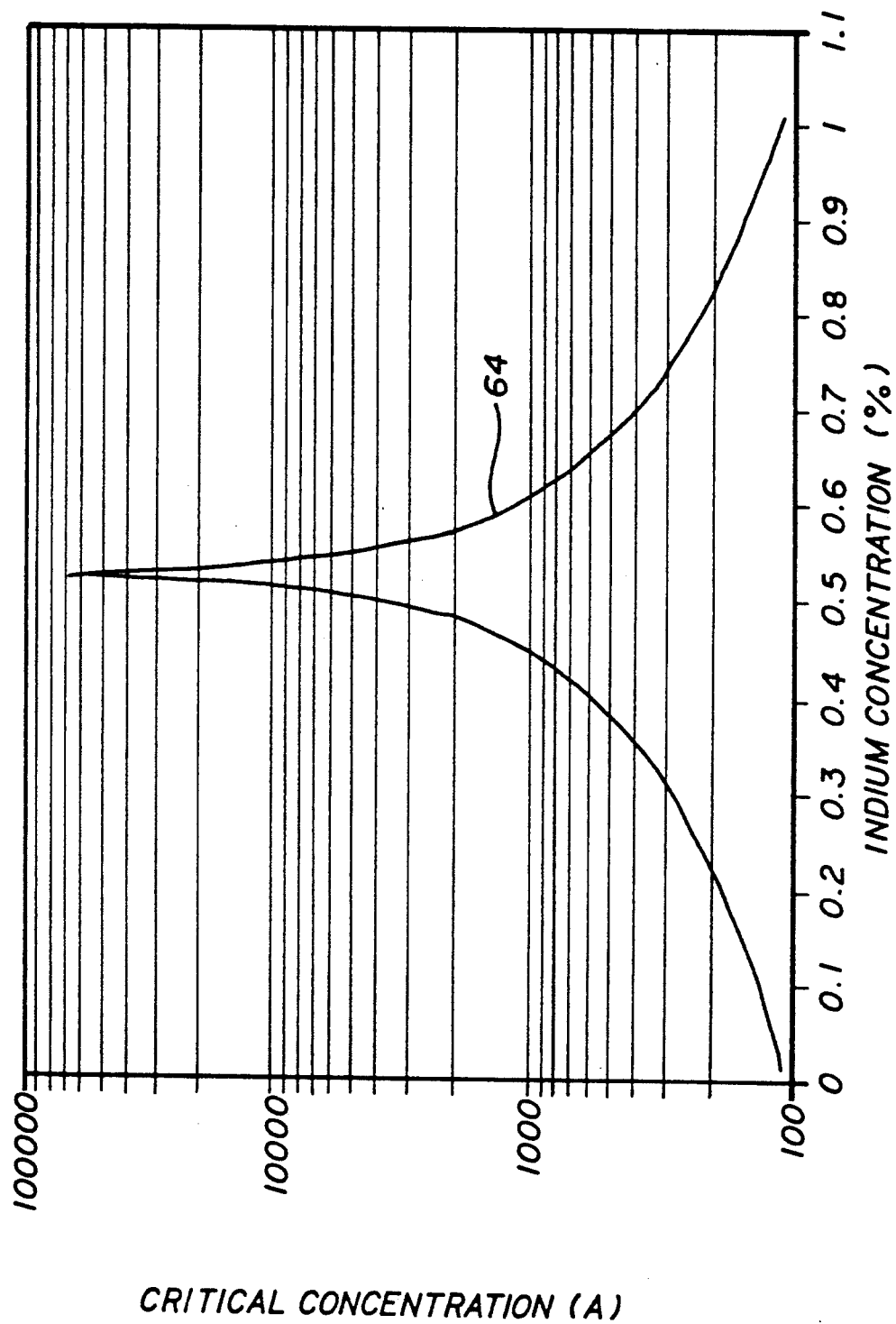

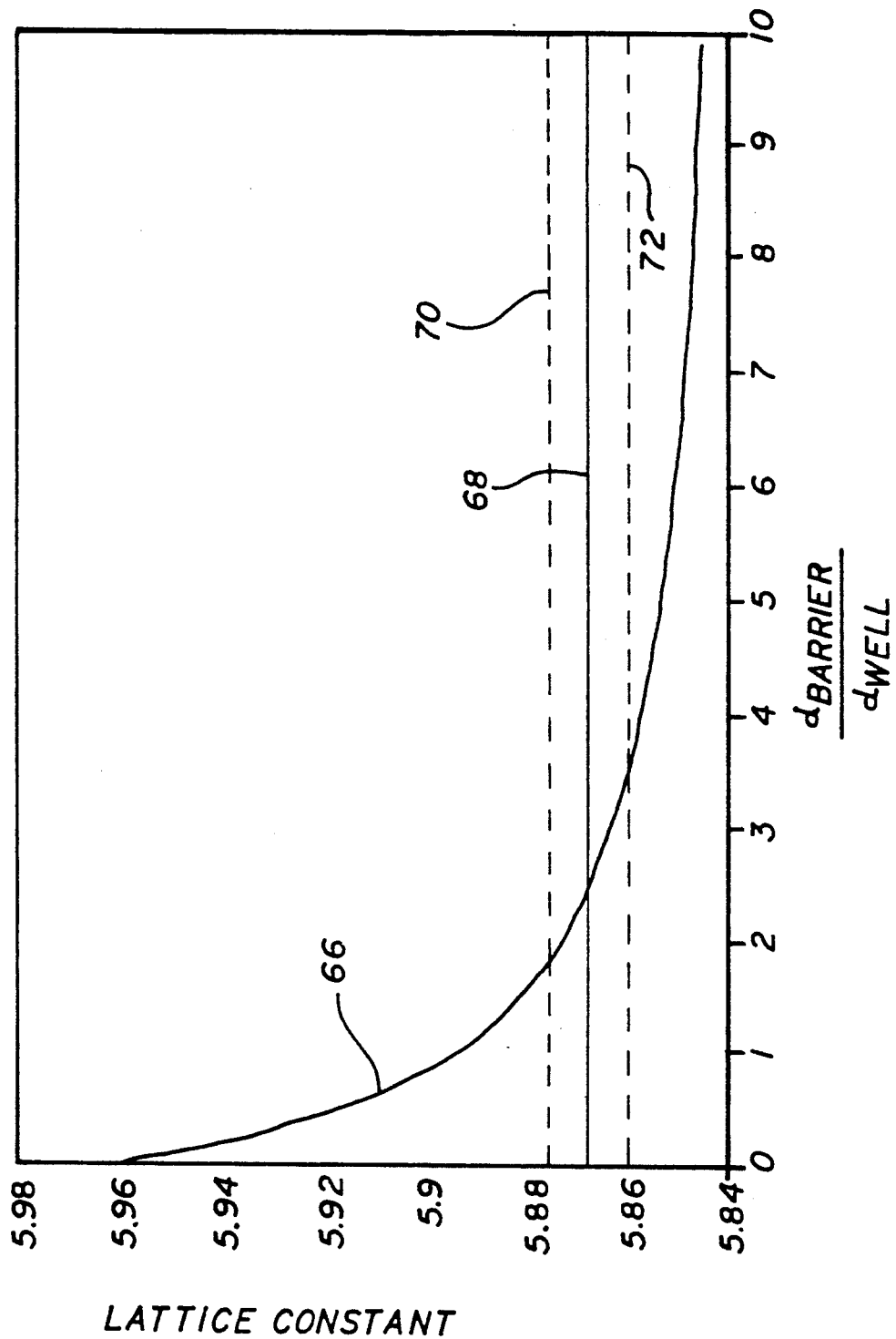

LIGHT DETECTOR USING INTERSUB-VALENCE BAND TRANSITIONS WITH STRAINED BARRIERS

TECHNICAL FIELD

The present invention relates to light detectors, and, more particularly, to semiconductor quantum well detectors.

BACKGROUND ART

The primary focus of the present invention is sensitive and fast detection of infrared signals, with particular emphasis on imaging arrays. Until recently, two main classes of infrared photoconductive detectors have been under investigation. These either employ band-to-band transitions or dopant-to-band transitions. The band-to-band detectors usually require semiconductors whose band edge is close to the wavelengths to be measured. In the infrared, such detectors are typically fabricated in materials which are difficult to make into imaging arrays, such as HgCdTe. Alternatively, the detectors requiring dopants operate at very low temperature. For this reason there has been a search for new detectors.

Recent advances designed to overcome the limitations of either band-to-band or dopant-to-band detector have used intersub-band transitions. The first example is in quantum wells using the intersub-conduction band transitions first reported by L. C. West and S. J. Eglash, *Applied Physics Letters*, Vol. 46, pp. 1156–1158 (1985). This detector uses quantum wells to provide discrete energy level subbands for the electrons. Transitions take place within subbands. B. F. Levine et al, *Applied Physics Letters*, Vol. 56, pp. 851–853 (1990) have improved the quantum well infrared photodetector by using the confined energy level to unconfined miniband transition. The unconfined miniband lies above the barrier level. With this transition, the detectivity of the detector has reached as high as $1 \times 10^{10}$ cm Hz$^{\frac{1}{2}}$/W. However, this detector has a serious limitation, in that because of selection rules, as described by D. D. Coon and R. P. G. Karunasiri, *Applied Physics Letters*, Vol. 45, pp. 649–651 (1984), light incident from above onto the detector is not absorbed. Hence these detectors require an end-fire coupling, or a corrugated surface (for grating coupling), which automatically reduces their sensitivity. Furthermore, even with proper optical coupling, there is automatically a reduction of a factor of two in quantum efficiency because of the selection rules which utilize only one polarization of light. An additional problem for this detector is that the dark current is extremely large.

B. F. Levine et al, *Applied Physics Letters*, Vol. 59, pp. 1864–1866 (1991), proposed and demonstrated a detector that is sensitive to light incident from above. This detector uses intersub-valence bands; that is, transitions between the occupied confined heavy hole and the unoccupied continuum states.

These two detectors are compared in Table I below, which provides a comparison of the responsivity, gain, quantum efficiency, absorption coefficient of the quantum well, mean free path of the carrier, dark current, D*, and geometry for the 40 Å n-doped GaAs/Al$_{0.3}$Ga$_{0.7}$As intersubconduction band detector (West and Eglash, supra; Levine et al, 1990, supra) at 10.7 μm at 4 V and a 40 Å p-doped GaAs/Al$_{0.25}$Ga$_{0.75}$As intersub-valence band quantum well detector (Levine et al, 1991, supra) at 8.4 μm at 5 V. The size of both detectors was 200×200 μm, with 50 quantum wells each.

TABLE I

Comparison of the Properties of Two Prior Art Detectors.

| | 40 Å p-doped Intersub-valence Band Quantum Well Detector | 40 Å n-doped Intersub-conduction Band Quantum Well Detector |
|---|---|---|
| Responsivity (A/W) | 0.039 | 1.0 |
| Gain | 0.024 | 0.8 |
| Quantum efficiency | 28% | 20% |
| Absorption Coefficient (1/cm) | 8,212 | 13,000 |
| Mean free path (Å) | 408 | 13,800 |
| Dark Current (A) | $\approx 1 \times 10^{-7}$ A | $\approx 3 \times 10^{-5}$ A |
| D* (cm Hz$^{\frac{1}{2}}$/W) | $1.7 \times 10^{10}$ | $4.0 \times 10^{10}$ |
| Geometry | Normal | Non-normal |

The advantage of the intersub-valence band detector is that it can be used with normal incident light. The problem with the intersub-valence band detector is that its responsivity and gain are low. This is the result of the heavy hole being much more massive than the conduction electron, which causes a very short mean free path of the heavy hole after it leaves its potential well. In the barriers, the heavy and light hole states are degenerate, which decreases the lifetime of the hole carriers, since scattering between states insure some heavy hole nature in the carriers. It is this decreased mean free path and lifetime which causes the gain and responsivity much lower than the intersub-conduction band quantum well detector. Although the dark current decreases by a factor of 300, further reduction in the dark current is desirable.

Thus, what is desired is a quantum well detector that combines the advantages of intersub-valence band detectors, namely, the use of incident light normal to the detector, with the higher responsivity and gain of the intersub-conduction band detector. In addition, the dark current must be reduced.

DISCLOSURE OF INVENTION

In accordance with the invention, intersub-valence band transitions are employed to detect light. The responsivity and gain are considerably improved by using barriers that are strained, typically under tension. It is this tensile strain in the barriers that gives rise to the improved properties, while enabling the use of incident light normal to the detecting plane of the detector by using the valance band.

By differentially straining both the barriers and the wells, many quantum wells can be grown without reaching the critical thickness. In addition, it is possible to decouple the dark current and the optical properties, so that a desirable reduction in the dark current does not entail an undesirable reduction in the optical properties. In this way, both small dark current and excellent optical detection specifications may be realized.

BRIEF DESCRIPTION OF THE DRAWINGS

FIG. 1a is a cross-sectional view of a typical infrared photoconductive detector of the prior art, in which light is incident normal to the surface;

FIG. 1b is an energy diagram showing band-to-band transition at k=0 for the detector of FIG. 1a, where k is the wave vector in k-space;

FIG 1c is an energy diagram showing dopant-to-band transition at k=0 for the detector of FIG. 1a;

FIG. 2b is an energy diagram showing intersub-conduction band transition at k=0 for the detector of FIG. 2a;

FIG. 3b is an energy diagram showing intersub-valence band transition at k=0 for the detector of FIG. 3a;

FIG. 4a is a schematic cross-section of the intersub-valence band detector of the invention, in which incident light is normal to the quantum wells;

FIG. 4b is a bulk electronic band structure of a portion of the detector of FIG. 4a, comprising an $In_{0.77}Ga_{0.23}As$ (well) and $In_{0.45}Al_{0.21}Ga_{0.34}As$ (barriers) on an InP substrate, in which the well is under compressive strain and the barriers are under tensive strain;

FIG. 7, on coordinates of critical thickness (in Å) and percent indium concentration, is a plot of the critical thickness for $In_xGa_{1-x}As$ on InP as a function of indium concentration;

FIG. 8, on coordinates of lattice constant and ratio of barrier thickness to well thickness, is a plot of the lattice constant of the free standing multilayer $In_{0.77}Ga_{0.23}As/In_{0.45}Al_{0.21}Ga_{0.34}As$ as a function of the ratio of barrier to well thickness;

BEST MODES FOR CARRYING OUT THE INVENTION

Figure 2A:
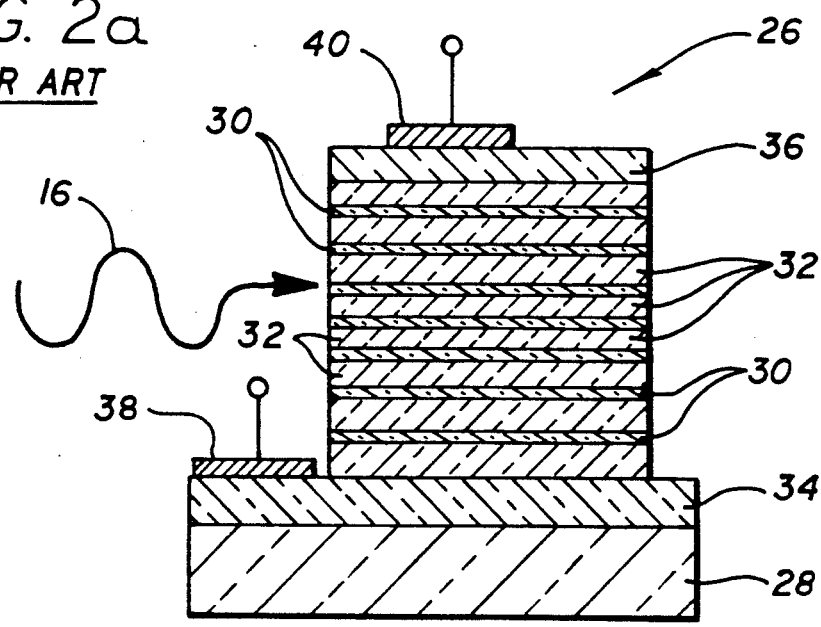
FIG. 2a is a schematic cross-sectional view of the intersub-conduction band detector of the prior art, in which incident light is non-normal to the quantum wells.

Shown in FIGS. 1a, 1b and 1c are a typical schematic cross-section for prior art detectors and their semiconductor band energy diagrams, outlining the transition which takes place using each detector type. FIG. 1a depicts light detector 10 comprising an epitaxial layer 12 of HgCdTe on a substrate 14 of CdTe. The thickness of the HgCdTe layer 12 is about 10 to 15 μm, while the thickness of the CdTe substrate 14 is on the order of a few hundred μm. The HgCdTe epilayer 12 is usually n-doped to about $5 \times 10^{14}$ cm$^{-3}$ or less. Light 16 is incident normal to the surface and changes the conductance which is measured by electrodes 18a, 18b.

FIG. 1b is an energy diagram showing the band-to-band transition at k=0 from light 16 exciting an electron from the valence band edge 20 to the conduction band edge 22. The photo-carriers increase the conductivity.

FIG. 1c is an energy diagram showing the dopant-to-band transition at k=0 from light 16 exciting an electron from the dopant level 24 to the conduction band edge 22. The photo-carriers increase the conductivity.

Figure 2B:
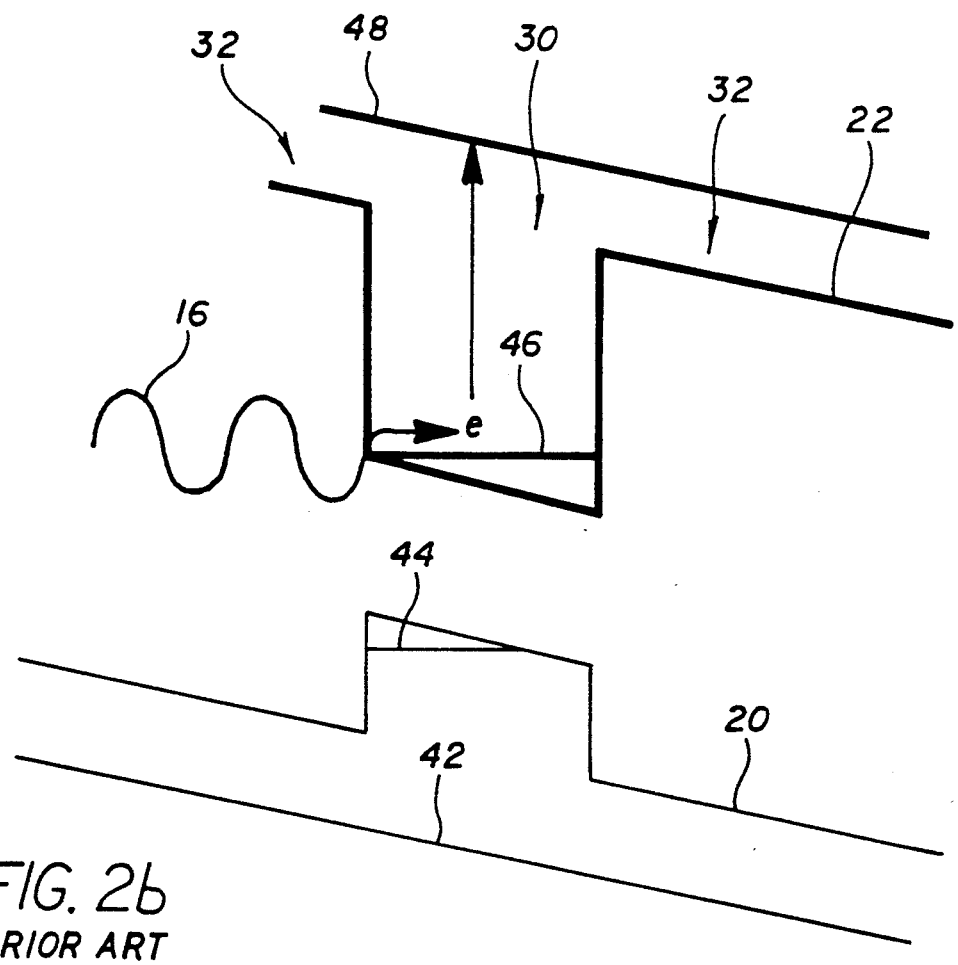

A typical schematic cross-section for the intersubconduction band detector 26 and its energy band diagram disclosed by Levine et al, 1990, supra, are shown in FIGS. 2a and 2b. In this device, a semi-insulating GaAs substrate 28, a few hundred μm thick, supports the device 26, which comprises a plurality of n-doped GaAs quantum wells 30, and a plurality of $Al_{0.25}Ga_{0.75}As$ barriers 32 alternating with the quantum wells 30 sandwiched between a bottom n-doped GaAs contact layer 34 and a top n-doped GaAs contact layer 36. There are 50 periods of alternating quantum wells 30 and barriers 32; each quantum well is about 40 Å thick and each barrier is about 480 Å thick.

A first Au/Ge contact layer 38 provides ohmic contact to the bottom contact layer 34, while a second Au/Ge contact layer 40 provides ohmic contact to the top contact layer 36. Incident light 16 is non-normal to the quantum wells 30. The quantum wells 30 and contact layers 34, 36 are n-doped typically $\approx 1 \times 10^{18}$ cm$^{-3}$.

FIG. 2b is an energy diagram showing intersub-conduction band transition at k=0 in a quantum well 30. The hole miniband 42, confined heavy hole level 44, confined electron energy level 46, and electron miniband 48 are depicted.

Figure 3A:
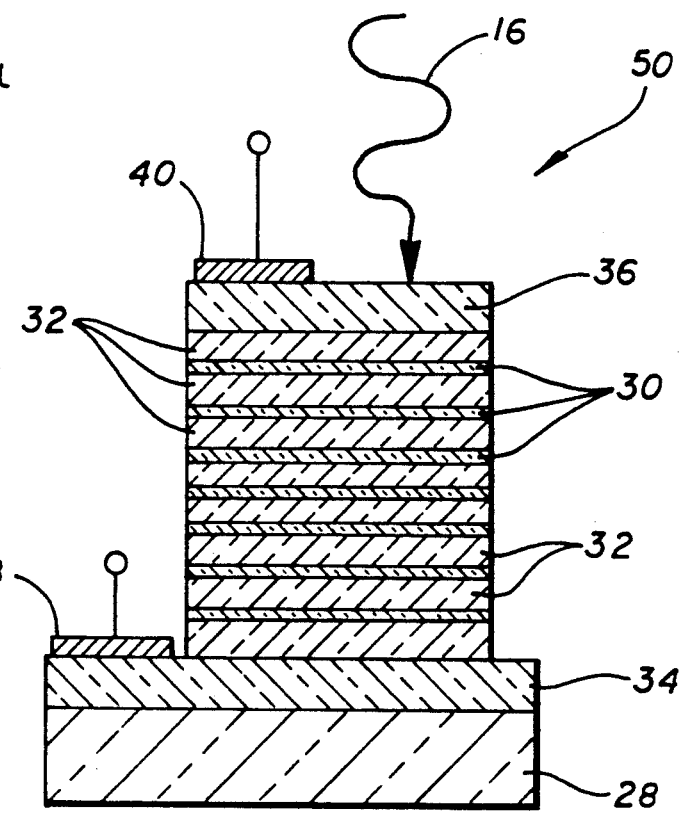
FIG. 3a is a schematic cross-sectional view of the intersub-valence band detector of the prior art, in which incident light is normal to the quantum wells.
Figure 3B:
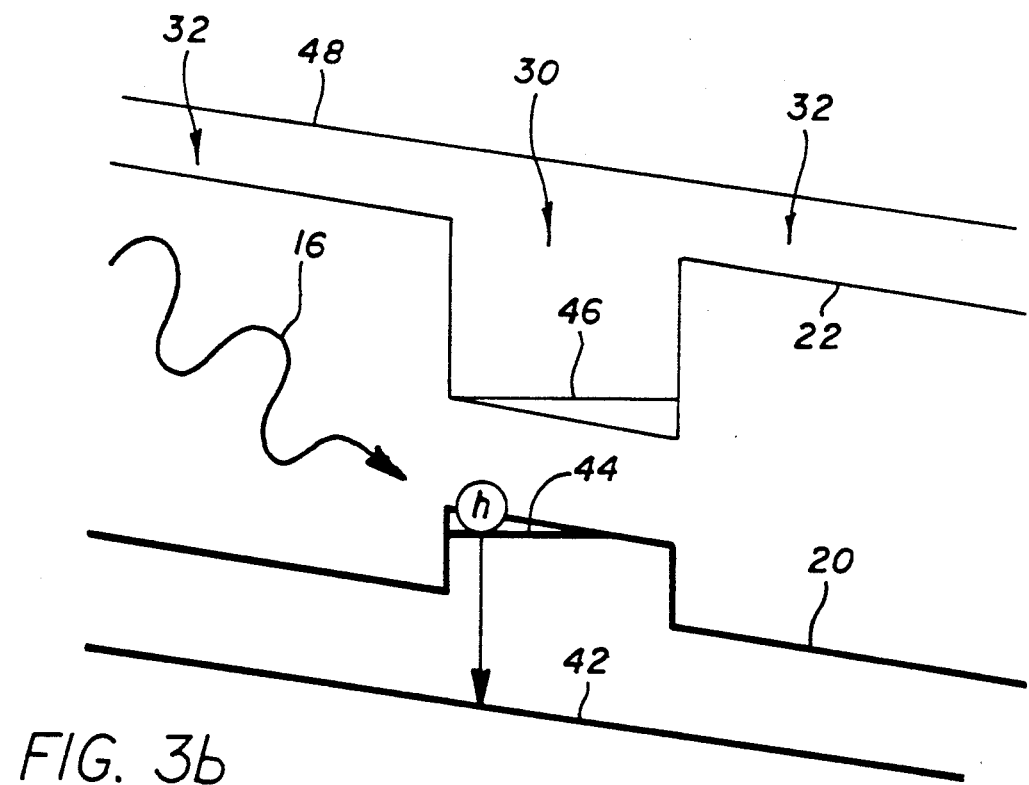

A typical schematic cross-section for the intersubvalence band detector 50 and its energy band diagram disclosed by Levine et al, 1991, supra, are shown in FIGS. 3a and 3b. The configuration of this detector is very similar to that depicted in FIG. 2a, except that quantum wells 30 and the bottom and top contact layers 34 and 36, respectively, comprise p-doped GaAs, which provides hole carriers. The barrier layers 32 comprise 300 Å thick $Al_{0.3}Ga_{0.7}As$ layers; the quantum wells 30 are 40 Å thick. Incident light 16 is normal to the quantum wells 30. The quantum wells 30 and contact layers 34, 36 are p-doped typically $\approx 4 \times 10^{18}$ cm$^{-3}$. The heavy and light hole degeneracy is removed in the quantum well 30 due to quantization. In this case, the light causes the hole to go from the confined heavy hole 44 to the hole miniband 42.

The present invention uses the intersub-valence band transitions similar to Levine et al, but adds features to allow the photo-current to be carried by purely light hole states, which are more mobile than the degenerate heavy and light hole carriers in the above-mentioned device 50. This is done by tailoring the strain in the material so that once the holes are excited out of their potential wells, they move as light holes. The light hole effective mass is substantially smaller than that of the heavy hole. Thus, the light holes are more mobile than the heavy holes, which allows for higher gain.

Figures 4C, 6:
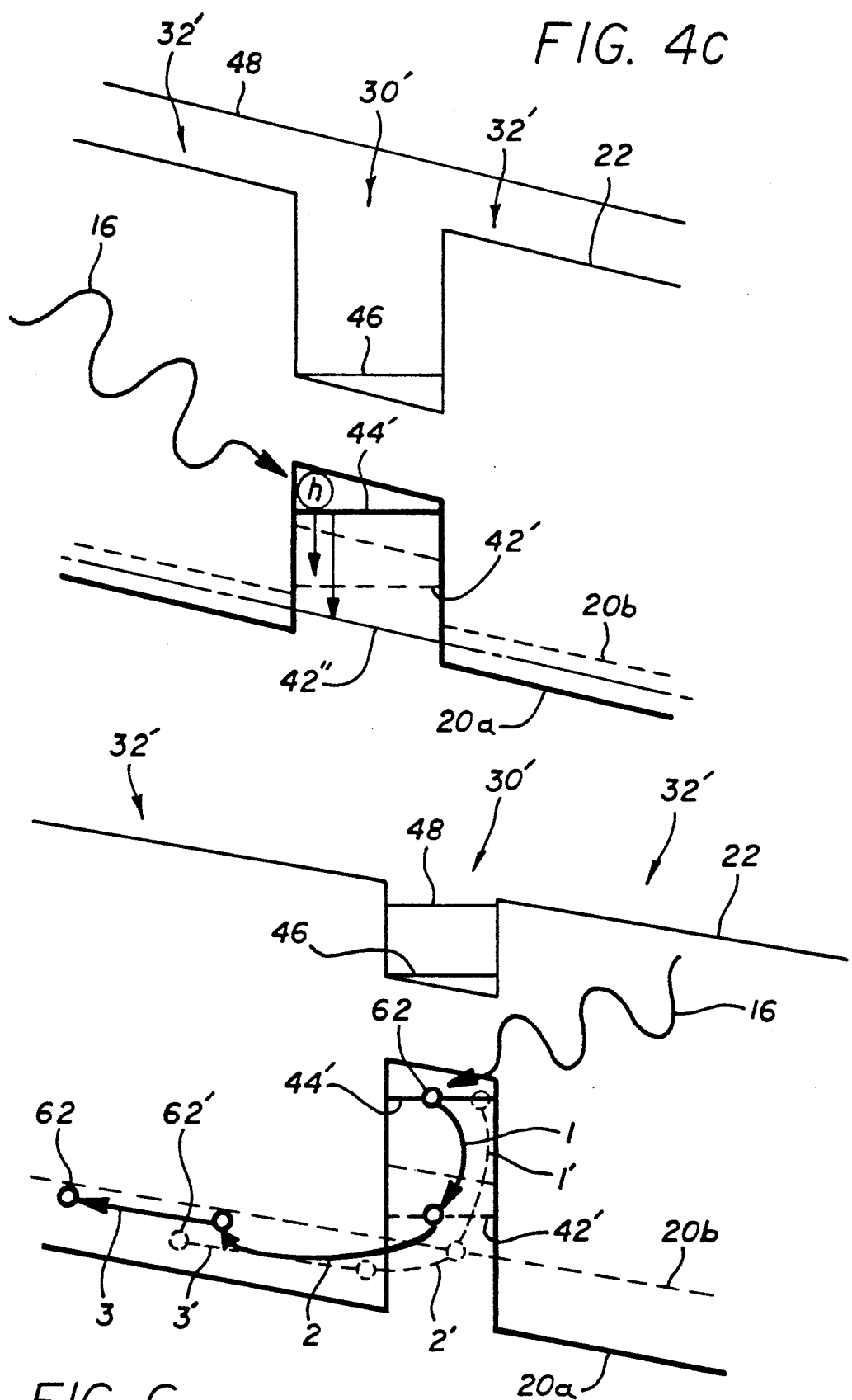
FIG. 4c is an energy diagram showing intervalence band transition in a p-doped quantum well for the detector of FIG. 4a, in which both the heavy and light degeneracy is removed in the well and the barrier.
FIG. 6 is an energy diagram depicting the mechanisms believed to be operative in the detector of the invention.

A typical schematic cross-section, bulk electronic band structure for the wells (strained under tension) and barriers (strained under compression), and energy band diagram for the detector 52 of the invention are shown in FIGS. 4a, 4b and 4c, respectively. What is considered novel over the intersub-valence detector of Levine et al is the use of differential strain between the quantum wells 30' and the barriers 32'. In particular, it is the use of tensile strain in the barriers 32' that allows the photocurrent to travel almost solely as light holes. All the performance specifications of the intersub-valence detector of Levine et al are believed to be met or exceeded with the additional advantage that the gain and sensitivity are expected to approach that of the intersub-conduction band detector.

Another critical issue for quantum infrared photodetectors is the large dark current. In the novel structure of the invention, the optical and electrical properties of the detector have been separated. In so doing, the optical properties will be comparable or improved with respect to prior art quantum well detectors, while dark current is decreased. In the structure of the invention, the heavy hole quantum well potential is deeper than the light hole quantum well potential due to differential strain. The ability for the hole carriers to be thermionically emitted from the confined heavy hole state to the heavy hole barrier region is reduced due to the increase in well depth. This will reduce the dark current. At the same time, the light hole quantum well depth has decreased, allowing the light hole photocarriers to drift to the barrier region, due to the applied electric field. It is expected, therefore, that the dark current, which is a major problem with present quantum well infrared photodetectors, will be substantially reduced.

Thus, the present invention solves the problems inherent with either of the previous detectors described in the prior art. Listed in Table II below is the expected results for the detector 52 of the invention. These results will be discussed in Section V, below. Table II sets forth the properties of a 40 Å p-doped $In_{0.77}Ga_{0.23}As/In_{0.45}Al_{0.21}Ga_{0.34}As$ intersub-valence band quantum well detector in accordance with the invention; these properties are to be compared with the properties listed for the prior art detectors 26, 50 in Table I.

TABLE II

| Properties of the Detector of the Invention. | |
|---|---|
| | 40 Å p-doped Intersub-valence Strained Band Quantum Well Detector |
| Responsivity (A/W) | 2.2 |
| Gain | 0.8 |
| Quantum efficiency | 48% |
| Absorption Coefficient (1/cm) | 16,424 |
| Mean free path (Å) | 13,800 |
| Dark Current (A) | $\approx 2 \times 10^{-9}$ A |
| D* (cm Hz$^{\frac{1}{2}}$/W) | $1.1 \times 10^{12}$ |
| Geometry | Normal |

In the detector 52 of the invention, the quantum wells 30' and the contact layers 34, 36, are p-doped typically $4 \times 10^{18}$ cm$^{-3}$. The barrier layers 32' comprise 200 Å thick $In_{0.45}Al_{0.21}Ga_{0.34}As$ layers; the quantum wells 30' comprise 40 Å thick p-$In_{0.77}Ga_{0.23}As$ layers. Shown in FIG. 4a is light 16 incident from the top, but the light could also be incident from the bottom. Also shown in FIG. 4a is the electrode 38 contacting layer 34, but the electrode could also contact the bottom of the substrate 28 if the substrate was p-doped. The semi-insulating substrate 28 comprises InP a few hundred μm thick, while the contact layers 34, 36 comprise p-$In_{0.53}Ga_{0.47}As$.

While the particular embodiment discussed above is directed to placing the quantum wells 30' under compressive strain and the barrier layers 32' under tensile strain, it will be appreciated that it is sufficient to place the barrier layers under tensile strain to obtain the differential strain. Placing the quantum wells 30' under compressive strain increases the differential strain and hence optimizes certain properties of the resulting device.

By increasing the strain, the separation between the heavy and light hole states increases. In the barrier region, the light hole state needs to be lower in energy than the heavy hole by several $k_BT$ in the tensile strain, where $k_B$ is the Boltzmann constant and T is the temperature. In this way, population to the upper heavy hole state due to thermal excitation is low. In the well regions, the amount of confinement or well depth in the heavy hole increases with increasing compressive strain. There is a trade-off between the amount of tensile strain in the barriers and compressive strain in the wells, which depends on (1) how many quantum wells are needed (critical thickness); (2) how mobile the carriers in the barriers need to be relative to the mobility of a light hole carrier; and (3) how low the dark current needs to be. In any event, the minimum difference between the light and heavy hole caused by the strain should be greater than 0.5 $k_BT$.

Strain in the layers is provided by making use of lattice constant mis-match between adjacent layers. Listed below in Table III are several suitable materials useful in the practice of the invention, including Si, Ge, and III-V binary semiconductors, their lattice constant, and bandgap energy.

TABLE III

| Material, Lattice Constant, and Bandgap. | | |
|---|---|---|
| Material | Lattice Constant (Å) | Bandgap (eV) |
| Si | 5.43 | 1.11 |
| Ge | 5.66 | 0.67 |
| AlP | 5.46 | 2.43 |
| AlAs | 5.66 | 2.16 |
| AlSb | 6.13 | 1.6 |
| GaP | 5.45 | 2.25 |
| GaAs | 5.65 | 1.42 |
| GaSb | 6.09 | 0.69 |
| InP | 5.88 | 1.28 |
| InAs | 6.06 | 0.36 |
| InSb | 6.48 | 0.17 |

A buffer layer (or substrate) may be of any composition. However, of the materials listed above, Si, Ge, GaAs, GaP, GaSb, InP, InAs, and InSb are preferred.

The barrier layers strained under tension should have a lattice constant less than that of the buffer layer (or substrate), while the quantum well layers strained under compression should have a lattice constant greater than that of the buffer layer (or substrate). The depth of the quantum wells depends on the bandgap. Thus, it is possible to preselect the wavelength detected by judicious selection of materials.

An example of one combination of materials suitably employed in the practice of the invention involves a buffer layer of $Si_xGe_{1-x}$, with the quantum wells comprising $Si_yGe_{1-y}$, where y<x, and the barriers comprising $Si_zGe_{1-z}$, where z>x. Another example involves a substrate (or buffer layer) of GaAs, with the quantum wells comprising InP and the barriers comprising GaP. Yet another example involves a substrate (or buffer layer) of GaAs, with the quantum wells comprising $In_{1-x}Ga_xAs$ and the barriers comprising $GaAs_yP_{1-y}$. In this last example, aluminum may be partially substituted for gallium; this substitution does not change the strain to any great extent, but does increase the bandgap, which in turn shifts the detected wavelength, as discussed below. The values of "x" and "y" are selected so as to provide sufficient strain to separate the light hole and heavy hole.

In FIG. 4b, "cb", "hh", and "lh" represent the conduction band, heavy hole band, and light hole band, respectively. The coordinates of energy (E) and k-space (k) are also shown.

Due to the strain introduced, the heavy and light hole degeneracy is removed and the barrier 32', forming a heavy hole valence band edge 20a and a light hole valence band edge 20b. Transitions occur between the confined heavy hole level 44' and the confined light hole level 42'. Transitions also occur between the confined heavy hole level 44' and the hole miniband 42".

PHYSICAL PRINCIPLES BEHIND INVENTION—AN ILLUSTRATIVE EXAMPLE

I. Energy Levels under Strain

To understand why the present invention allows the photo-current to travel as light holes, it is necessary to understand the effects of strain on the energy levels within a semiconductor.

Figure 5:
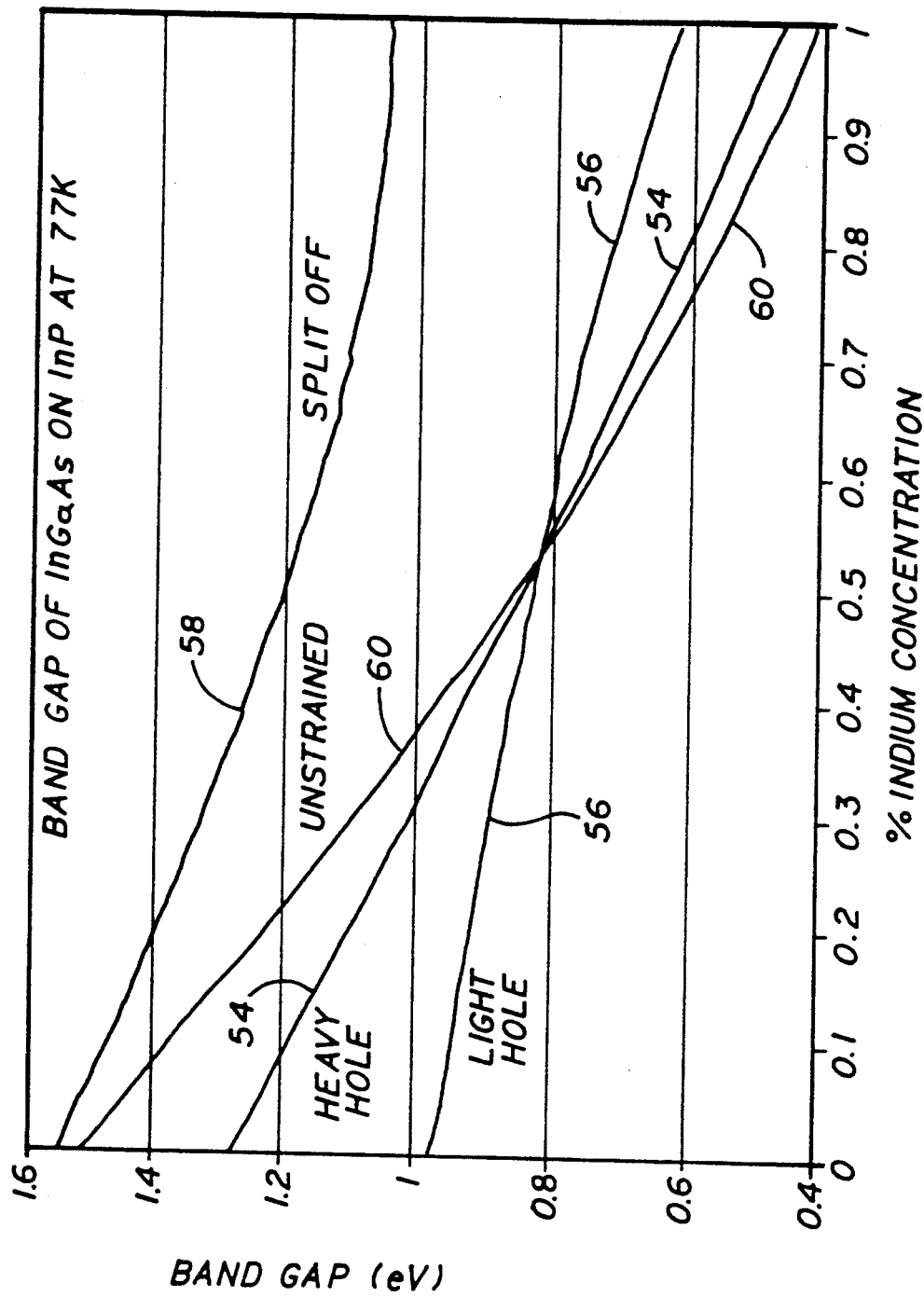
FIG. 5, on coordinates of bandgap energy (in electron volts) and % indium concentration, is a plot of the bandgap at k=0 for the heavy and light hole bands and the split-off band of $In_xGa_{1-x}As$ on InP as a function of indium concentration at 77K.

When a semiconductor is strained, the electronic energy levels shift. Shown in FIG. 5 is the energy gap at k=0 under strain for the heavy and light hole states (Curves 54, 56, respectively) and split-off states (Curve 58) as a function of indium concentration for $In_xGa_{1-x}As$ grown on InP substrate at 77K. The model for the bandgap calculations for one material on another shown in this Figure is based on G. Ji et al, *Journal of Applied Physics*, Vol. 62, pp. 3366-3373 (1987). Also shown is the bandgap of unstrained $In_xGa_{1-x}As$ (Curve 60). Since the lattice constant of $In_{0.53}Ga_{0.47}As$ is lattice-matched to InP, no strain is induced when $In_{0.53}Ga_{0.47}As$ is grown on InP; hence the heavy and light holes are degenerate at this point. If x<0.53, then $In_xGa_{1-x}As$ is under tension and it will be observed that in this regime, the light hole bandgap is lower in energy than the heavy hole. If x>0.53, then $In_xGa_{1-x}As$ is strained under compression, and the heavy hole band is lower in energy than the light hole.

As an example, consider a quantum well structure, with the barriers under tension and wells under compression. In the barriers, the light hole level will be lower in energy than the heavy hole level. In the wells strained under compression, the heavy hole level will be lower in energy than the light hole level. Shown in FIG. 6 are the band edges and quantized energy levels for the heavy hole (solid bold lines), and light hole (dashed lines), with the barriers under tension and the well under compression. In this example, the well is chosen to be $In_{0.77}Ga_{0.23}As$, and the barrier is $In_{0.45}Al_{0.21}Ga_{0.34}As$, because it is desired that (1) the heavy to light hole transition be $\approx$120 meV, and (2) both the heavy and light hole transitions be confined in the well. Since the lattice constant of AlAs and GaAs are very close (0.14% lattice mismatch), the aluminum concentration can be increased at will to increase the bandgap of the barrier or well without adding appreciable strain. Therefore, the aluminum concentration may be varied to obtain the desired transition energies.

While not subscribing to any particular theory, it appears that the mechanism of the operation of the detector 52 of the invention involves three steps: In Step 1, a hole 62 is excited from the heavy hole state 44' to the light hole state 42' via an absorption of the infrared light 16; in Step 2, the hole tunnels or is thermionically emitted out of the well 30' into the barrier 32'; and in Step 3, the hole travels as a light hole and is collected as photocurrent. Another possible mechanism is: in Step 1', a hole 62 is excited from the heavy hole state 44' to the hole miniband 42" via an absorption of IR light 16; in Step 2', the hole drifts into the barrier region 32'; and in Step 3', the hole is collected as photocurrent and travels as a light hole 62'.

II. Investigation of Whether the Proposed Structure of the Invention Can Be Grown From a practical growth point of view for high quality epilayers, the thickness of the barrier or the well grown on InP should be below their respective critical thicknesses. As an illustrative example, shown in FIG. 7 is the critical thickness of $In_xGa_{1-x}As$ on InP (Curve 64) using the model described by J. W. Matthews and A. E. Blakeslee in *Journal of Crystal Growth*, Vol. 27, pp. 118-125 (1974). The critical thickness of $In_{0.77}Ga_{0.23}As$ and $In_{0.45}Al_{0.21}Ga_{0.34}As$ on InP are $\approx$9,000 Å and $\approx$250 Å, respectively. Although it is a necessary condition that the individual barrier and well width be below the critical thickness, it is not a sufficient condition for application purposes. Since many wells are needed to make a useful device, the net strain of the barriers and wells must also be small. Shown in FIG. 8 is the lattice constant of a free standing multi-layer $In_{0.77}Ga_{0.23}As$/$In_{0.45}Al_{0.21}Ga_{0.34}As$ as a function of the ratio of the barrier to well widths (Curve 66), as described by J. P. Hirth and A. G. Evans in *Journal of Applied Physics*, Vol. 60, pp. 2372-2376 (1986) and J. W. Matthews and A. E. Blakeslee, *Journal of Vacuum Science and Technology*, Vol. 14, pp. 989-991 (1977). Also shown as a solid horizontal line (68) is the lattice constant of InP, and ±0.14% lattice mismatch to InP (dashed lines 70, 72). When the lattice constant of the free standing multi-layer is near the lattice constant of InP, then the net strain due to a period of the quantum well structure is small, and many such periods may be grown on the InP substrate without creating misfit dislocations. The barrier-to-well widths ratio for this composition may easily be grown as small as 5:1 with only a 0.25% lattice mismatch.

III. Expected Spectral Response of Illustrative Detector

Figure 9:
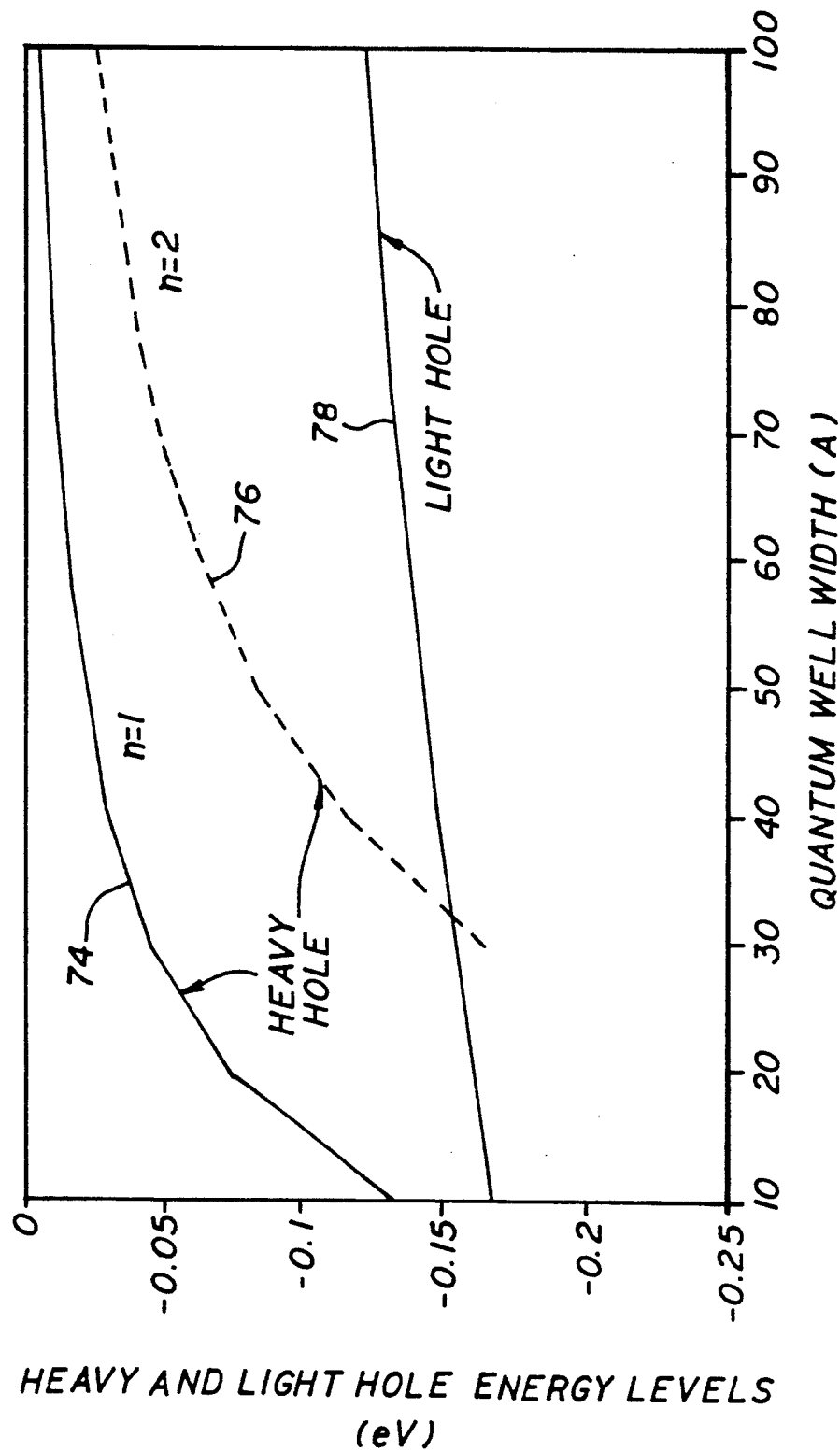
FIG. 9, on coordinates of energy level (in electron volts) and quantum well width (in Å), is a plot of the heavy and light hole quantum confined states in a $In_{0.77}Ga_{0.23}As/In_{0.45}Al_{0.21}Ga_{0.34}As$ quantum well as a function of well width.
Figure 10:
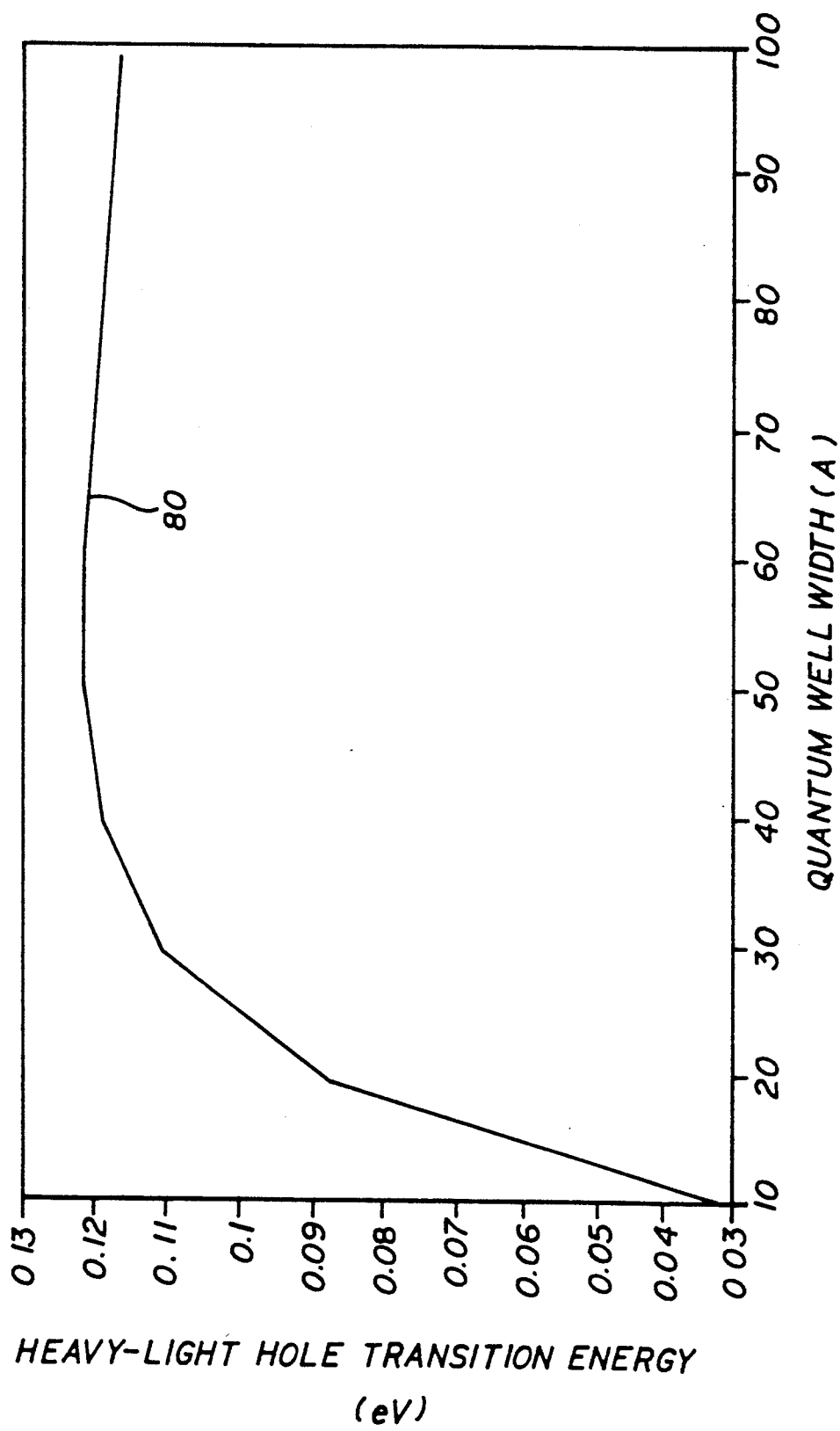
FIG. 10, on coordinates identical to those of FIG. 9, is a plot of the heavy to light hole transition energies for a $In_{0.77}Ga_{0.23}As/In_{0.45}Al_{0.21}Ga_{0.34}As$ quantum well as a function of well width.

As an illustrative example, shown in FIG. 9 are the heavy and light hole energy states in a $In_{0.77}Ga_{0.23}As$/$In_{0.45}Al_{0.21}Ga_{0.34}As$ quantum well as a function of the well width. Curves 74 and 76 are drawn for heavy holes, where n=1 and n=2, respectively. where n is the quantum well number; Curve 78 is drawn for light holes. For a 40 Å single quantum well, the heavy hole level lies 179 meV from the top of the heavy well, and the light hole level lies 27 meV from the top of the light well. The transition energy from the heavy hole to the light hole level is shown FIG. 10 as a function of the well width (Curve 80). For a 40 Å quantum well, the transition energy is 113 meV. This calculation assumes a 40% valence band discontinuity between the light bandgap of the barrier and the heavy hole bandgap of the well, and uses the effective masses in Table IV. These effective masses have been linearly interpolated from Levine et al, 1990, supra, and from S. Adachi, *Journal of Applied Physics*, Vol. 58, pp. R1–R29 (1985).

TABLE IV

| | Effective Masses for the Light Hole in $In_{0.45}Al_{0.21}Ga_{0.34}As$, and the Electron, Heavy and Light Hole in $Al_{0.3}Ga_{0.7}As$. | | | |
|---|---|---|---|---|
| | Light Hole $In_{0.45}Al_{0.21}Ga_{0.34}As$ | Electron $Al_{0.3}Ga_{0.7}As$ | Heavy Hole $Al_{0.3}Ga_{0.7}As$ | Light Hole $Al_{0.3}Ga_{0.7}As$ |
| Effective Masses (Barrier) | 0.0616 | 0.0919 | 0.543 | 0.0968 |

For the example discussed above of a 40 Å p-doped $In_{0.77}Ga_{0.23}As/In_{0.45}Al_{0.21}Ga_{0.34}As$ quantum well, when a photon of energy 113 meV is incident on the sample, a hole lying in the lowest heavy hole level can absorb the photon and be excited to the lowest light hole level. When the quantum well is under an electric field, the hole can tunnel out of the well and therefore create a photo-current, which can be measured as shown in FIG. 6. Another possibility is that the lowest heavy hole level absorbs a photon and is excited to the miniband. When the quantum well is under an electric field, the hole can tunnel out of the well, and therefore create a photo-current, which can also be measured.

The spectral response of the detector in the above example has a maximum near 113 meV or 11 μm with a spectral width of a few micrometers, covering most of the important 8 to 14 μm atmospheric window. By varying the aluminum concentration in the barriers, or by varying the indium concentration in the barrier or wells, the maximum response can be designed to be at 310 meV or 4 μm, with a spectral width covering most of the 3 to 5 μm atmospheric window. By using the heavy hole to split-off transition as described in the next section, even shorter wavelength detection (826 meV or 1.5 μm) may be realized.

IV. Using the Split-Off Band to Achieve a Two-Wavelength Detector

In another embodiment of the present invention, the detector 52 may be configured to detect simultaneously in both the 3 to 5 μm and 8 to 14 μm wavelength bands, which comprise the two infrared atmospheric windows. This concept is to use the heavy hole to split-off band for the higher energy transition and the heavy to light hole for the smaller energy transition. By properly designing the various alloy concentrations, the detector may simultaneously detect both the 113 meV or 11 μm light using the heavy hole to light hole transition, and the 310 meV or 4 μm light using the heavy hole to split-off transition. The split-off energies in InAs and GaAs are $\approx 300$ meV, making the 3 to 5 μm heavy hole to split-off transition possible. An example is shown in FIG. 11.

Figure 11:
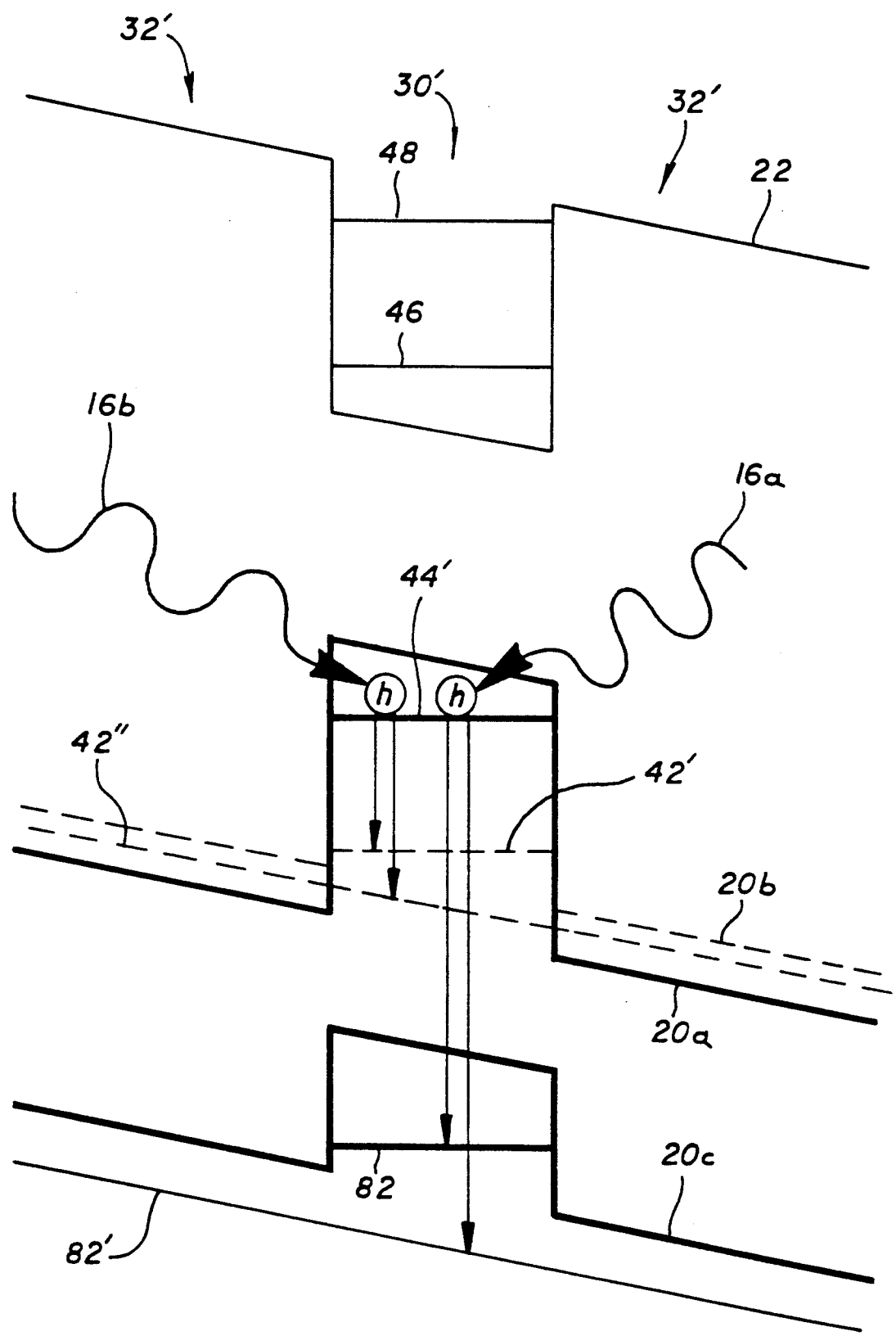
FIG. 11 is an energy diagram illustrating a simultaneous two-wavelength detector scheme with a quantum well under compression and barriers under tension.

In FIG. 11, light 16a is in the region of about 3 to 5 μm, while light 16b is in the region of about 8 to 14 μm. Both sources of light are incident on the confined heavy hole level 44'. The confined heavy to confined light hole or hole miniband transitions occur as above for the longer wavelength light, while the heavy hole to split-off band occurs from the confined heavy hole level 44' to the confined split-off level 82 or split-off miniband 82' in the split-off band edge 20c for the shorter wavelength light.

V. Analysis of Detector Characteristics

The basics of the photoconductor detector 52 of the invention, the existing p-doped intersub-valence band quantum well photoconductor 50, and the n-doped intersub-conduction band quantum well detector 26 are now described, together with the advantages and improvement of the present invention over these prior art detectors.

For a good light detector, the responsivity must be high, while the dark current, which introduces noise, must be low. According to E. L. Derniak and D. G. Grove in *Optical Radiation Detectors*, John Wiley & Sons, Inc., New York (1984), p. 97, the responsivity $\Re$ for a photoconductor may be expressed as $$\Re = \frac{q \lambda \eta}{h c} G, \quad (1)$$

where q is the charge of an electron, λ is the wavelength of the photon, h is Planck's constant, c is the speed of light, η is the quantum efficiency, and G is the gain. From Derniak and Grove, supra, the gain may be expressed as $$G = L/l \quad (2)$$

where L is the mean free path of the hole carrier, and l is the total width of all the quantum well and barrier regions and η may be expressed as $$\eta = A(1 - e^{-2 \alpha l_{qw}}), \quad (3)$$

where α is the absorption coefficient of the quantum well, $l_{qw}$ is the total width of all the quantum well regions, and A is a constant depending on the polarization dependency of the detector. For the n-doped intersub-conduction band quantum well detector 26, $A = \frac{1}{2}$, and for the p-doped intersub-valence band quantum well detector 50, $A = 1$. Another figure of merit used for the detector is the detectivity, D*, which, according to Derniak and Grove, supra, may be expressed as $$D^* = \sqrt{A \Delta f} \; \frac{\Re}{i_{noise}}, \quad (4)$$

where Δf is the bandwidth, A is the area of the detector, $i_{noise}$ is the current noise from the detector. Eqns. 1–4 are used to estimate the improvement possible using the present invention.

By straining the barriers 32' under tension, the lowest energy level for the hole is the light hole level. The effective mass of the light hole in the $In_{0.45}Al_{0.21}Ga_{0.34}As$ barrier is 0.0616, while the effective mass of the heavy hole in the barrier is 0.468, in the example calculated here. Since the effective mass of the lowest energy hole is dramatically reduced by strain, the mean free path is expected to increase, and therefore the gain will increase over the intersub-valence detector 50. The mean free path is expected to approach that of the electron in the n-doped intersub-conduction band quantum well, since the light hole effective mass is even less then that of the electron. Factors such as the scattering between the heavy hole and light hole state, however, might decrease the mean free path. For the example illustrated above, the energy difference between the two levels is $\approx 40$ meV, or 6 $k_BT$ (T=77K), thus scattering is unlikely and any decrease in the mean free path from that of the heavy hole should be small. Although the light hole effective mass of the detector of the invention is 33% smaller than the electron effective mass in $Al_{0.3}Ga_{0.7}As$, the gain of the present detector 52 is conservatively estimated to be the same as the GaAs/$Al_{0.3}Ga_{0.7}As$ n-doped intersub-conduction band quantum well detector 26.

The absorption of the intersub-valence band quantum well depends upon the mixing of the wavefunction with s orbital nature of the electrons in the conduction band and the wavefunction in the light hole band. The mixing, to a first order perturbation, depends inversely on the separation of the conduction band and the light hole level. For GaAs, the bandgap in the well is 1.424 eV, while for the $In_{0.77}Ga_{0.23}As$ /$In_{0.45}Al_{0.21}Ga_{0.34}As$ device, the bandgap in the well is 0.7 eV. Thus, the absorption coefficient is expected to increase by a factor of 2 over GaAs.

The dark current ($I_{dark}$) is due to thermionic emission, which may be expressed using the Richard-Dushman equation as $$i_{dark} \propto m^* e^{\frac{-\Delta E}{k_BT}}, \qquad (5)$$

where $m^*$ is the effective mass, $\Delta E$ is the difference in energy of the barrier height and the quantum confined level in the well, $k_B$ is the Boltzmann constant and T is the temperature. The light hole effective mass in $In_{0.45}Al_{0.21}Ga_{0.34}As$ (barrier) and the electron, heavy hole and light hole in $Al_{0.3}Ga_{0.7}As$ (barrier) are shown in Table III, above. The energy difference $\Delta E$ for the light hole barrier to heavy hole confined energy level is 179 meV in the device 52 of the invention. By comparison, that of a 40 Å p-doped intersub-valence band quantum well detector 50 is 157 meV. If the effective mass in $Al_{0.3}Ga_{0.7}As$ is approximated as an average effective mass between the heavy and light hole in the barrier and taking the increase in barrier height ($\Delta E$) using Eqn. (5), then the dark current should decrease by a factor of 41 over the 40 Å p-doped intersub-valence band quantum well 50. The quantum well width or the aluminum concentration could be increased to further decrease the dark current. It is worth pointing out that uncertainty in the bandgap discontinuity makes the exact energy level of the heavy hole difficult to calculate, and that the dependency of the dark current upon the energy level is exponential and therefore very sensitive.

Levine et al, 1991, supra, have shown that the noise for the intersub-valence band detectors is mainly from shot noise, which may be expressed as $$i_{noise} = \sqrt{4 q g \Delta f i_{dark}}. \qquad (6)$$

Thus, by using Eqns. 5 and 6, the net result of decreasing the dark current and increasing the gain leads to a calculated decrease in noise of only 10%.

By comparing the estimated improved gain and quantum efficiency performance characteristics of the present invention with the p-doped intersub-valence band quantum well detector 50, the inventors determined that using intersub-valence band transitions in strained barriers 32' under tension and strained p-doped quantum wells 30' under compression increases the quantum efficient to 48%, gain to 0.8, responsivity to 2.2 A/W, and the detectivity, $D^*$, to approximately $1.1 \times 10^{12}$ cm $Hz^{\frac{1}{2}}$/W, which is an increase of $D^*$ of 65. These are the numbers given in Table II; see Table I for a comparison of the 40 Å n-doped GaAs/$Al_{0.25}Ga_{0.75}As$ intersub-conduction band quantum well detector 26, and the 40 Å p-doped GaAs/$Al_{0.3}Ga_{0.7}As$ intersub-valence band quantum well detector 50.

However, it will be appreciated that it is the use of barriers strained under tension that provides an improved detector. Such barrier strain affords differential strain between the quantum wells, which themselves may be unstrained, strained under tension as the barriers (but not as much, in order to provide differential strain), or, most preferably, strained under compression (to provide maximum differential strain).

There exists a relationship between the lattice constant and alloy concentration, and the alloy concentration and bandgap of the material. By changing the ternary alloy concentration, then the lattice constant and bandgap changes, but not independently. Thus, the amount of strain and the confinement in the quantum well changes. By going from a ternary to a quaternary material, the lattice constant and the bandgap can be changed independently. Essentially, this adds another degree of freedom, and thus more flexibility in the designing of the structure. An example is that aluminum could be added to a ternary material containing gallium, thus making the material quaternary. By doing so, very little additional strain is added, but the bandgap of the material will increase. The net result then would be to shift the detected wavelength.

The features believed to be novel and distinguishable from existing technology are that in the detector of the invention, the barriers are strained under tension, thereby increasing the effective mass of the hole carrier, which greatly improves the detector's responsivity and detectivity and allows the p-doped intersub-valence band detector to be tailored for numerous applications at various wavelengths. This provides a detector that is at least comparable if not better in performance to presently used n-doped intersub-conduction band quantum well detectors without the limitation of having to use non-normal incident light and without the automatic 50% reduction in efficiency due to acceptance of only one polarization.

Possible variations and modifications of the invention are now discussed. One possible modification is to use other III-V material systems. By using other III-V semiconductors, such as InSb, the heavy hole to light hole transition energy may be varied. Thus varying the alloy concentration in the well and barrier, as well as using various semiconductors, the detector's spectral response may be tuned to suit the particular applications, and performance may be improved and optimized. Also, using quaternary materials for the barrier or well allows more degrees of freedom and thus can further improve the performance of the device.

Another variation is to use the split-off band, in particular to produce a two-color detector, which has been discussed in Section IV. Also, the split-off energy in InSb and InP is $\approx 800$ meV, and $\approx 100$ meV, respectively. By using the heavy hole to split-off transition, higher (≈800 meV) and lower (≈100 meV) energy detectors may be realized. Thus, by changing alloy concentration of various semiconductors, both wavelengths of the two-color detector may be tuned to suit the particular applications.

It may be possible to use Si/Ge materials, since this material is also lattice mismatched. The same principle of using strain may be used to improve current Si/Ge infrared detectors.

INDUSTRIAL APPLICABILITY

The light detector of the invention can be easily integrated in infrared imaging arrays, with interest in satair pollution detection, tracking gas leaks, intrusion, and wildlife monitoring, moving target identification, laser radar and satellite applications, and medical applications, such as thermal imaging.

Thus, there has been disclosed a light detector employing intersub-valence band transitions with strained barriers. It will be readily apparent to those skilled in this art that various changes and modifications of an obvious nature may be made without departing from the spirit of the invention, and all such changes and modifications are considered to fall within the scope of the invention, as defined by the appended claims.

What is claimed is:

1. A detector for detecting light having a wavelength and comprising a plurality of alternating quantum wells and barriers formed either on a substrate or on a buffer layer formed on a supporting substrate, said quantum wells and barriers formed from semiconductor materials with p-doping within at least one of (a) said plurality of quantum wells and (b) said plurality of said barriers, having light holes generated by incident light from heavy holes due to intersubvalence band transitions, said detector operating by means of predominantely light holes which remain light holes in said barriers as a result of tensile strain sufficient to induce an energy difference between said light holes and said heavy holes of greater than 0.5 $k_BT$, where $k_B$ is the Boltzmann constant and T is the operating temperature in kelvins, with said light holes having a lower energy than said heavy holes.

2. The detector of claim 1 wherein absorption of light occurs in said quantum wells and wherein said carriers move in said strained barriers under tension.

3. The detector of claim 1 wherein said barriers are strained under tension and said quantum wells are strained under compression or under less tension than said barriers to provide differentially strained barriers and quantum wells.

4. The detector of claim 3 wherein said differentially strained quantum wells and barriers for a period comprising one quantum well and one barrier region have a free standing multi-layer lattice constant which is lattice-matched to said substrate or said buffer layer.

5. The detector of claim 1 wherein said semiconductor materials comprise a III-V, IV, IV-IV, or II-VI binary, ternary, quaternary, or strained layer superlattice semiconductor composition.

6. The detector of claim 1 wherein said substrate comprises a semiconductor material selected from the group consisting of Group IV semiconductor elements and Group III-V binary compound semiconductors.

7. The detector of claim 6 wherein said semiconductor material is selected from the group consisting of silicon, germanium, GaAs, GaP, GaSb, InP, InAs, and InSb.

8. The detector of claim 1 wherein said substrate or buffer layer has a lattice constant between that of the compositions comprising said quantum wells and said barriers.

9. The detector of claim 8 wherein said substrate or buffer layer comprises GaAs, said quantum wells comprise InP, and said barriers comprise GaP.

10. The detector of claim 8 wherein said substrate or said buffer layer comprises GaAs, said quantum wells comprise $In_{1-x}Ga_xAs$, and said barriers comprise $GaAs_yP_{1-y}$, where the values of x and y are selected to induce said strain.

11. The detector of claim 10 wherein said gallium in at least one of said quantum wells and said barriers is at least partially replaced with aluminum so as to alter the bandgap thereof and hence alter the wavelength of detection.

12. The detector of claim 8 wherein said substrate or buffer layer comprises InP, said quantum wells comprise $In_xGa_{1-x}As$, with $x<0.53$, and said barriers comprise $In_yAl_{1-y}As$, with $y>0.53$.

13. The detector of claim 8 wherein said buffer layer comprises $Si_xGe_{1-x}$, said quantum wells comprise $Si_yGe_{1-y}$, with $y<x$, and said barriers comprise $Si_zGe_{1-z}$, with $z>x$.

14. A two-color detector employing a heavy hole to light hole transition to detect light at a first wavelength, and the heavy hole to split-off transition to detect light at a second and different wavelength, said heavy hole to light hole transition achieved by a plurality of alternating quantum wells and barriers formed either on a substrate or on a buffer layer formed on a supporting substrate, said quantum wells and barriers formed from semiconductor materials with p-doping within at least one of (a) said plurality of quantum wells and (b) said plurality of said barriers, with said light holes generated by incident light from said heavy holes due to intersubvalence band transitions, said light holes remaining light holes in said barriers as a result of tensile strain sufficient to induce an energy difference between said light holes and said heavy holes of greater than 0.5 $k_BT$, where $k_B$ is the Boltzmann constant and T is the operating temperature in kelvins, with said light holes having a lower energy than said heavy holes.

15. The two-color detector of claim 14 wherein said first wavelength is in the range of about 8 to 14 μm and wherein said second wavelength is in the range of about 3 to 5 μm.

* * * * *